(12) United States Patent
Harada (10) Patent No.: US 6,570,229 B1
(45) Date of Patent: May 27, 2003

(54) SEMICONDUCTOR DEVICE (75) Inventor: Hirofumi Harada, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/549,360

(22) Filed: Apr. 14, 2000

(30) Foreign Application Priority Data

Apr. 19, 1999 (JP) .......................................... 11-111368

(51) Int. Cl.⁷ .............................................. H01L 29/76
(52) U.S. Cl. ........................ 257/373; 257/371; 257/369; 257/335
(58) Field of Search ................. 257/370–373, 257/378, 335–343; 438/350–358

(56) References Cited

U.S. PATENT DOCUMENTS

| | | | |
|---|---|---|---|
| 4,561,168 A | * 12/1985 | Pitzer et al. | 29/571 |
| 4,866,495 A | * 9/1989 | Kinzer | 257/337 |
| 5,485,027 A | * 1/1996 | Williams et al. | 257/343 |
| 5,648,281 A | * 7/1997 | Williams et al. | 347/33 |
| 6,159,841 A | * 12/2000 | Williams et al. | 438/619 |

FOREIGN PATENT DOCUMENTS

JP  55-82461  * 6/1980  ........... H01L/27/06

* cited by examiner

Primary Examiner—Tom Thomas
Assistant Examiner—Ori Nadav
(74) Attorney, Agent, or Firm—Adams & Wilks (57) ABSTRACT An insulated gate N-channel field effect transistor has a P-type semiconductor substrate, an N-type epitaxial layer disposed on the P-type semiconductor substrate, and a gate insulating film disposed on the N-type epitaxial layer. An N-type high concentration source region is formed in the N-type epitaxial layer. An N-type high concentration drain region is formed in the epitaxial layer in spaced-apart relation to the N-type high concentration source region. A channel forming region is disposed between the N-type high concentration source region and the N-type high concentration drain region. A gate electrode is formed on the channel forming region through the gate insulating film. An N-type low concentration region is disposed between the N-type high concentration drain region and the channel forming region and between the N-type high concentration source region and the channel forming region. An insulating film is disposed on the low concentration region. A P-type well layer surrounds the N-type high concentration drain and source regions and is disposed in a region including the channel forming region and only a part of the region under the insulating film.

8 Claims, 6 Drawing Sheets

SEMICONDUCTOR DEVICE

BACKGROUND OF THE INVENTION

1. Field of the Invention

The present invention relates to an insulated gate N-channel field effect transistor having a withstand voltage of 10 V or more at a semiconductor substrate which can incorporate a Bipolar or CMOS and on which an epitaxial layer is formed. The present invention also relates to a semiconductor device including this insulated gate N-channel field effect transistor.

2. Description of the Related Art

Figure 5:
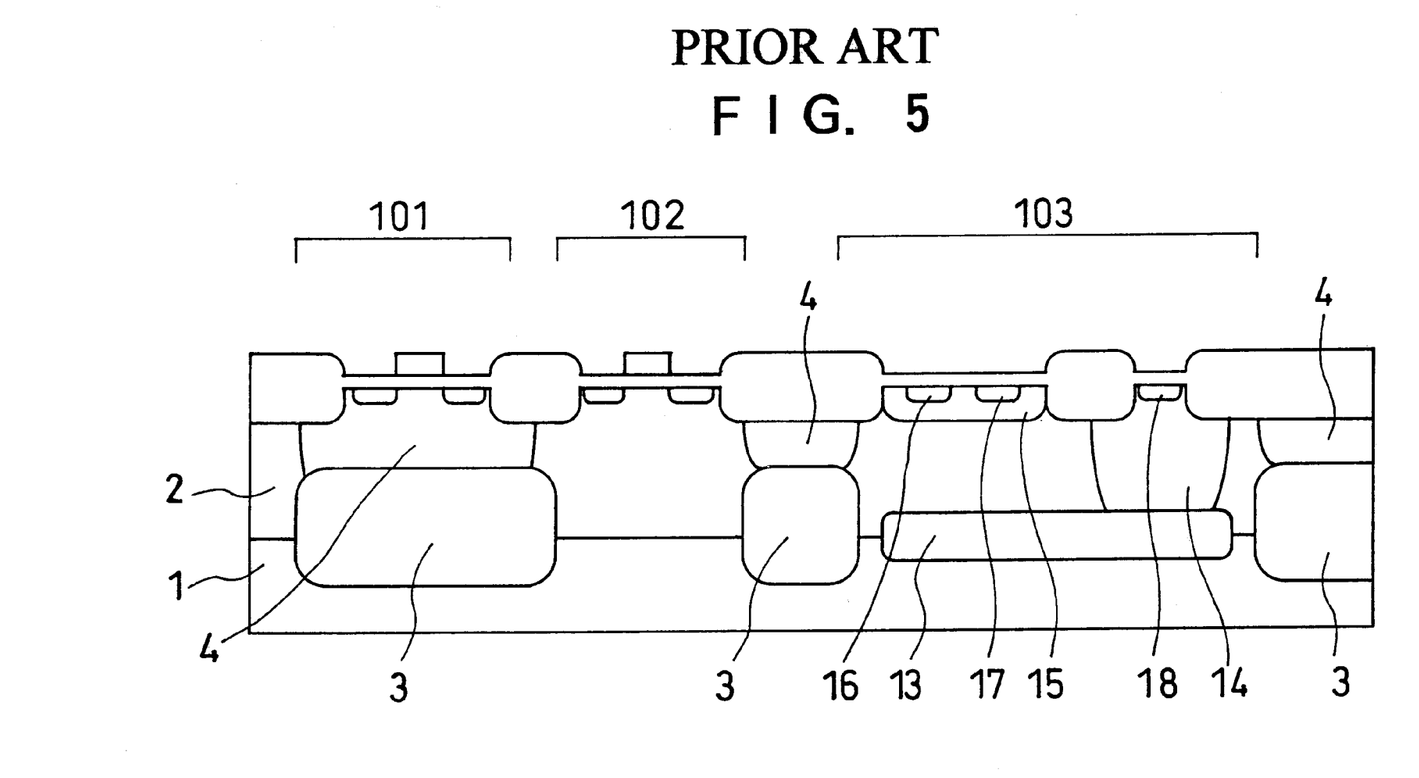
FIG. 5 is a schematic sectional view of a BiCMOS integrated circuit including an insulated gate field effect transistor and a bipolar transistor.

FIG. 5 is a sectional view of an example of BiCMOS integrated circuits, which is manufactured by using a P-type semiconductor substrate 1 and through an N-type epitaxial step. An N-channel insulated gate field effect transistor 101 is formed in a P-type well layer 4 formed in an N-type epitaxial layer 2. A P-type insulated gate field effect transistor 102 is formed in a region of the N-type epitaxial layer 2. An NPN vertical bipolar transistor 103 is manufactured in such a manner that a P-type base diffusion region 15 and N-type sinker 14 are formed in the N-type epitaxial layer 2 on an N-type buried layer 13. Separation between respective elements, especially, the separation between the insulated gate field effect transistor and the bipolar transistor can be made in such a manner that a P-type buried layer 3 and the P-type well layer 4 are subjected to diffusion from an upper side and a lower side of the N-type epitaxial layer and are brought into contact with each other.

The thickness of the N-type epitaxial layer depends on the performance of an objective integrated circuit. As an example, when the withstand voltage of the NPN vertical bipolar transistor is set to 15 V or more, preferably the thickness thereof is set to 4 $\mu$m or more. As for the N-type sinker 14, for the purpose of lowering collector resistance and lowering h fe of a parasitic bipolar, the concentration thereof is preferably selected from a range of $5 \times 10^{17}$ to $1 \times 10^{19}/cm^3$. Also, the depth thereof is preferably selected from a range of 3 to 5 $\mu$m.

Figure 2:
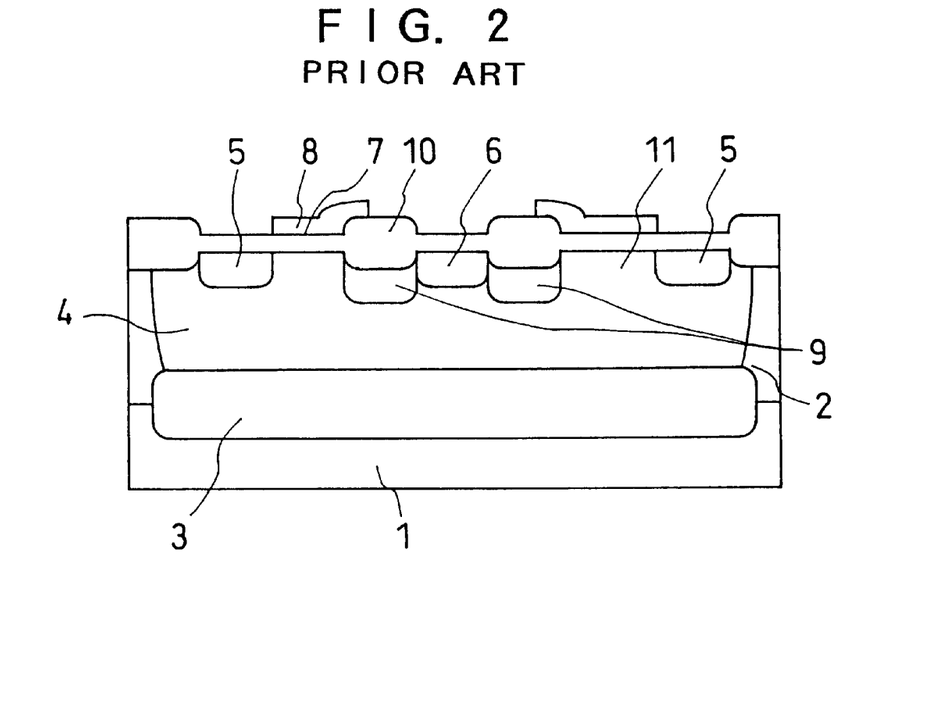
FIG. 2 is a schematic sectional view of a conventional insulated gate N-channel field effect transistor.

FIG. 2 is a sectional view of an example of an insulated gate N-channel field effect transistor used at a semiconductor substrate including an epitaxial layer in a BiCMOS integrated circuit.

Reference numeral 1 denotes a semiconductor substrate, and a P-type semiconductor substrate is generally used. An N-type epitaxial layer 2 of $1 \times 10^{14}$ to $1 \times 10^{16}/cm^3$ is formed on this P-type semiconductor substrate, and elements are formed therein. In case of the N-channel insulated gate field effect transistor, a P-type well layer 4 and optionally a P-type buried layer 3 are formed, and BiCMOS integrated circuit is formed in this P-type region. Reference numerals 5 and 6 each denote a source region and a drain region of the insulated gate field effect transistor, in which P (Phosphorus) or As (Arsenite) is implanted to make the concentration as high as $1 \times 10^{20}/cm^3$ or more. A gate electrode 8 is formed over a channel forming region 11 through a gate insulating film 7. However, an N-type low concentration region 9 of $1 \times 10^{16}$ to $1 \times 10^{18}/cm^3$ is formed between the drain region 6 and the channel forming region 11, with the result that a withstand voltage between the drain and source can be raised as compared with the case where this low concentration region does not exist.

This is because a depletion layer on the drain side is apt to extend in this low concentration region as compared with general insulated gate field effect transistors. As a result, there is an effect to suppress the avalanche breakdown from occurring in the junction between the drain region and the channel forming region. The length of this low concentration region depends on a desired withstand voltage. However, the length is preferably set between 1.5 $\mu$m and 3 $\mu$m in the case where the desired withstand voltage is within a range of 15 V to 40 V. When the insulating film on the N-type low concentration region is made thicker than the gate insulating film, it is possible to avoid occurrence of a high electric field between the gate and drain, as well as preventing a leak and breakdown caused by this. It is preferable to set the thickness of this insulating film 10 thicker than the gate insulating film be 0.1 $\mu$m or more. For example, a field insulating film for separating elements may also be used as the film.

Figure 3:
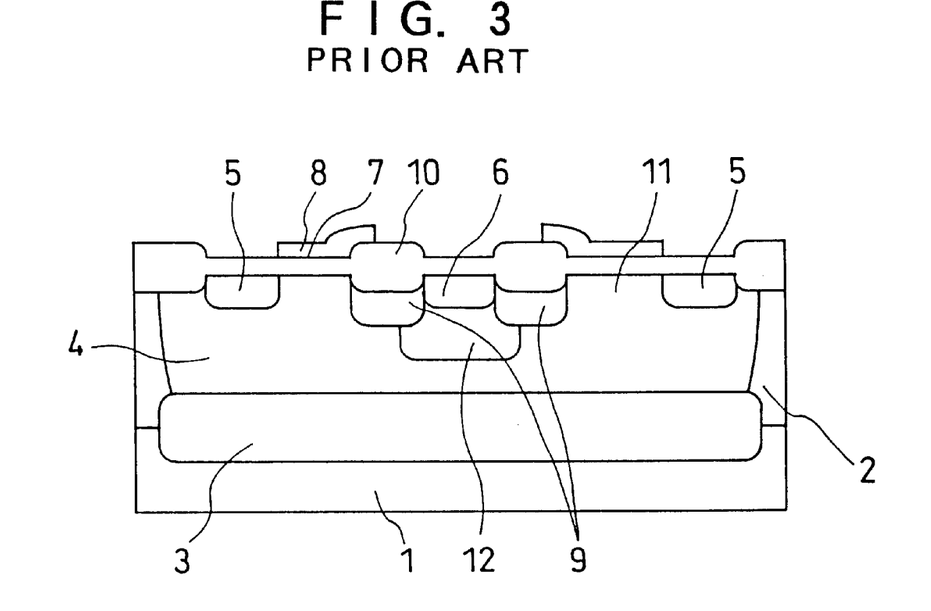
FIG. 3 is a schematic sectional view of another conventional insulated gate N-channel field effect transistor.

However, the insulated gate field effect transistor having the structure of FIG. 2 has a low ESD (electric static discharge) strength. Accordingly, there is a defect in that when a drain terminal is connected to an external pad, junction breakdown is liable to occur in the N-type low concentration region by static electricity entering the drain terminal from outside. In order to prevent the breakdown by the static electricity, for example, there is a method in which a specific protective element is provided at a wiring line communicating with a pad in a circuit. However, by providing this protective element, an area of a semiconductor integrated circuit is increased, resulting in an increase of the cost. In order to improve the ESD strength of the insulated gate type transistor without using the protective element (for preventing an increase of an area of a semiconductor integrated circuit), as shown in FIG. 3, there is a method in which a deep N-type diffusion region 12 is formed around a high concentration drain region as a center, for instance. However, this method also causes a cost increase arising from the increase of steps, since a mask step and a diffusion step must be newly added to form the N-type diffusion region. The higher the concentration of the N-type diffusion layer 12 is, and the deeper the depth of diffusion from the surface of the N-type epitaxial layer 2 is, the better the ESD strength can be increased. For example, in the case of HBM (human body model), in order to obtain an ESD strength of 2 kV or more, it is appropriate that the concentration of the N-type diffusion layer is $1 \times 10^{16}/cm^3$ or more and the depth is 1.5 $\mu$m or more.

As described above, in the insulated gate field effect transistor, for the purpose of making the high withstand voltage compatible with the high ESD strength, it is impossible to avoid the increase in the step corresponding to one masking process. In addition, a potential (herein referred to as "body potential" to be distinguished from a potential of the P-type semiconductor substrate) of a region of this element where a channel is formed becomes the same as a potential of the P-type semiconductor substrate that is the lowest potential on the circuit. Therefore, an application to a multi-system power source IC including a charge pump circuit having a circuit structure in which the element has a body potential different from the lowest potential on the circuit is difficult.

SUMMARY OF THE INVENTION

Then, for the purpose of solving such a problem inherent in the prior art, an object of the present invention is to make the high withstand voltage and high ESD strength of an insulated gate field effect transistor compatible with each other without using a protective element and without increasing steps, thereby realizing an element structure in which a body potential of the element can be freely changed.

In order to solve the above problem, according to the present invention, there is provided an insulated gate N-channel field effect transistor, comprising:

a source region and a drain region, each having an N-type and high concentration, formed on an N-type epitaxial layer formed on a P-type semiconductor substrate with an interval;

a channel forming region between the source region and the drain region;

a gate electrode formed through the channel forming region and a gate insulating film;

an N-type low concentration region formed between the drain region and the channel forming region;

an insulating film formed on the low concentration region and thicker than the gate insulating film;

a P-type well layer in a region including the source region, the channel forming region, and a part of the region under the insulating film thicker than the gate insulating film, and surrounding the drain region an N-type buried layer formed in a region, which is a boundary between the semiconductor substrate and the epitaxial layer, including the source region, the drain region, the channel forming region, and a region under the insulating film thicker than the gate insulating film; and a P-type buried layer including the source region, the drain region, the channel forming region, and a region under the insulating film thicker than the gate insulating film, the P-type buried layer being contained within the N-type buried layer as viewed from above and being formed beyond the upper and lower sides of the N-type buried layer in its depth direction, the upper portion of the P-type buried layer having a width extending to the P-type well layer from the upper side of the N-type buried layer.

The insulated gate N-channel field effect transistor set forth in the above, further comprises:

an N-type low concentration region formed between the drain region and the channel forming region;

an insulating film formed on the low concentration region and is thicker than the gate insulating film;

an N-type low concentration region formed between the source region and the channel forming region;

an insulating film formed on the low concentration region and is thicker than the gate insulating film; and a P-type well layer in a region including the channel forming region, and a part of the region under the insulating film thicker than the gate insulating film, and surrounding the drain region and the source region.

BRIEF DESCRIPTION OF THE DRAWINGS

In the accompanying drawings:

FIGS. 7A to 7E are sectional views showing a manufacturing process of an insulated gate N-channel field effect transistor of the present invention.

DETAILED DESCRIPTION OF THE PREFERRED EMBODIMENTS

Embodiment mode of the present invention will be described below with reference to the drawings.

The present invention relates to an insulated gate N-channel field effect transistor used in a BiCMOS integrated circuit as shown in the sectional view of FIG. 5. First of all, manufacturing steps of the insulated gate field effect transistor of the present invention will be described with reference to FIG. 7.

Figure 7A:
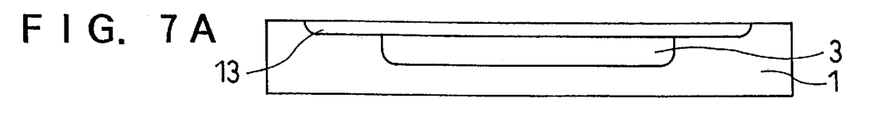
FIG. 7A is a sectional view showing a manufacturing process of an insulated gate where N-channel field effect transistor of the invention, after forming a p-type buried layer.
Figure 7B:
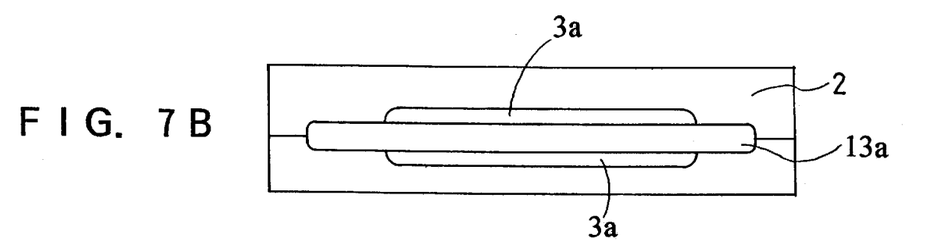
FIG. 7B is a sectional view showing a manufacturing process after forming an N-type epitaxial layer.

Firstly, a P-type semiconductor substrate 1 is prepared, and an N-type impurity such as SB or As is introduced into a part of this surface to form an impurity implantation region which is a region that subsequently becomes an N-type buried layer 13. For example, when an NPN vertical bipolar transistor is manufactured, an N-type buried layer is formed in its element region, thereby giving an effect to reduce a corrector resistance. An element region of the insulated gate N-channel field effect transistor of the present invention is also formed with the N-type buried layer 13 so that it is insulated an separated from the P-type semiconductor substrate 1. For example, when As is implanted, the implantation amount is desirably up to early of $10^{15}/cm^2$ to suppress a defect that may occur on the N-type buried layer 13. Then, B is implanted in a partial region on the semiconductor substrate 1 where a P-type buried layer 3 is to be formed. The P-type buried layer 3 is generally used to form an element separation region. According to the present invention B is implanted so that this P-type buried layer 3 is formed on the inside of the previously formed N-type buried layer 13 (FIG. 7A). The implantation amount is desirably up to a middle of $10^{14}/cm^2$ to suppress a defect that may occur on the P-type buried layer 3. In this way, a laminate of the N-type buried layer 13 and the P-type buried layer 3 is obtained in the present-invention as shown in FIG. 7A and the following figures. Subsequently, high temperature annealing is carried out at 1100° C. or more;

Next, an N-type epitaxial layer 2 is formed on the P-type semiconductor substrate 1. The film thickness and concentration are changed according to the performance of an element or circuit to be manufactured. At this time, the buried layer formed on the surface of the P-type semiconductor substrate 1 diffuses upward in the N-type epitaxial by thermal diffusion and auto doping during the epitaxial growth. In the insulated gate N-channel field effect transistor of the present invention, an N-type impurity and a P-type impurity for buried layers are implanted in regions overlaid as viewed from above in the figures. The resulting structure after formation of the N-type epitaxial layer 2 is shown in FIG. 7B. A P-type impurity B is more likely to be diffused by annealing than an N-type impurity SB or As, so that a P-type diffusion region 3a is formed on the upper and lower portions of an N-type diffusion region 13a. This N-type buried layer 13 is also used to insulated and separate the P-type semiconductor substrate 1 from the insulated gate N-channel field effect transistor. Hence, the impurity implantation amount of the P-type buried layer 3 and the N-type buried layer 13 must be chosen in such a range that the aforementioned defect may not occur to satisfy withstand voltage required for the circuit or element.

Figure 7C:
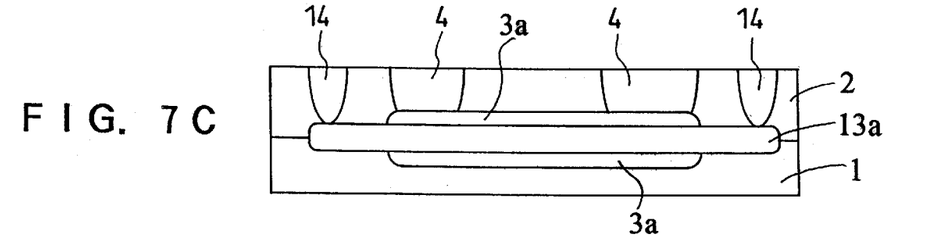
FIG. 7C is a sectional view showing a manufacturing process after forming an N+ sinker.

Next, in order to form a P-type well layer 4 from the surface of the N-type epitaxial layer 2, B is implanted and is diffused. This P-type well layer 4 is formed in an element region of an N-channel insulated gate field effect transistor, a PNP vertical bipolar transistor, or the like or an element separating region. Since the element separation is generally carried out by bringing the P-type well layer 4 and the P-type buried layer 3 into contact with each other from above and below, it is necessary to make process design by adjusting a heat treatment while taking the impurity implantation amount of the P-type buried layer 3 and the P-type well layer 4 into consideration. In the insulated gate N-channel field effect transistor of the present invention, although the P-type well, layer 4 is formed in a region where a channel is formed, the P-type well layer 4 is not purposely formed in a region where a high concentration drain region 6 is formed. Further, a portion of the P-type buried layer 3 on the N-type buried layer 13 is brought into contact with the P-type well layer 4. In the case where the NPN vertical bipolar transistor is integrated at the same time, an N+ sinker 14 is generally formed in a collector portion before or after this step, but this N+ sinker 14 may be also used to remove electrodes of the N-type buried layer 13 in the present invention (FIG. 7C).

Figure 7D:
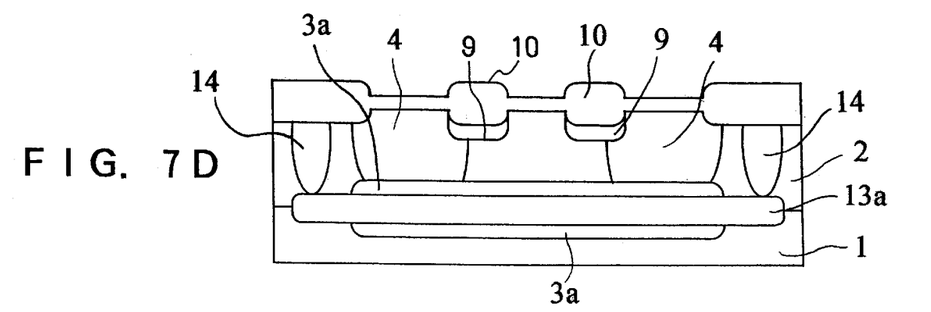
FIG. 7D is a sectional view showing a manufacturing process after forming an inversion prevention layer and a field insulating film.

Next, an inversion preventing layer 9 and a field insulating film 10 are formed. In the case where the insulated gate field effect transistor is formed, the field insulating film 10 and the inversion preventing 9 may be formed between the channel forming region and drain region at the same time. By doing so, the inversion preventing layer provides an N-type low concentration region, which is used to obtain a high drain withstand voltage without increasing a mask step (FIG. 7D).

Figure 7E:
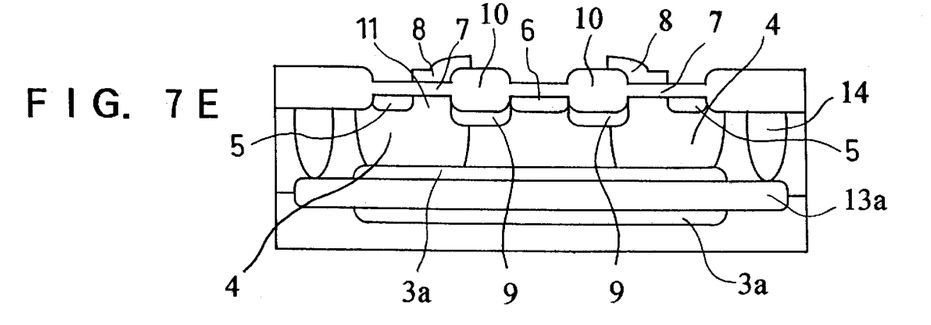
FIG. 7E is a sectional view showing a manufacturing process after forming a gate oxide film, gate electrode a high concentration source and drain regions.

Next, a process peculiar to a general insulated gate field effect transistor, such as formation of a gate oxide film 7, a gate electrode 8, a high concentration source region 5, and a high concentration drain region 6, is carried out (FIG. 7E). In the case where the bipolar transistor is integrated at the same time, although not shown purposely, a base diffusion step and the like are also added. Thereafter, although not shown, a semiconductor element is completed through steps of an intermediate insulating film, metal wiring, passivation, and the like.

Through the foregoing steps, the insulated gate N-channel field effect transistor that is insulated and separated from the semiconductor substrate can be obtained. In the processes, there is no process for only the insulated gate N-channel field effect transistor, but the present element can be easily manufactured by a normal manufacturing process of a BiCMOS.

Figure 1A:
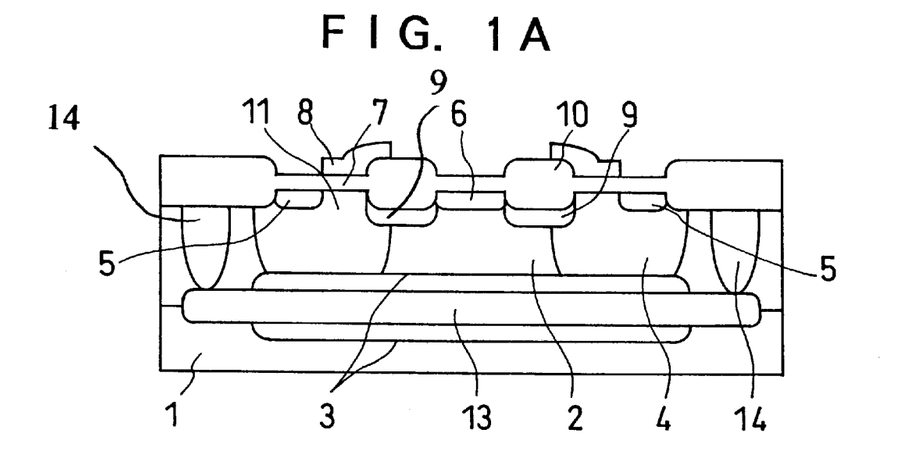
FIG. 1A is a schematic sectional view of an insulated gate N-channel field effect transistor of the present invention.
Figure 1B:
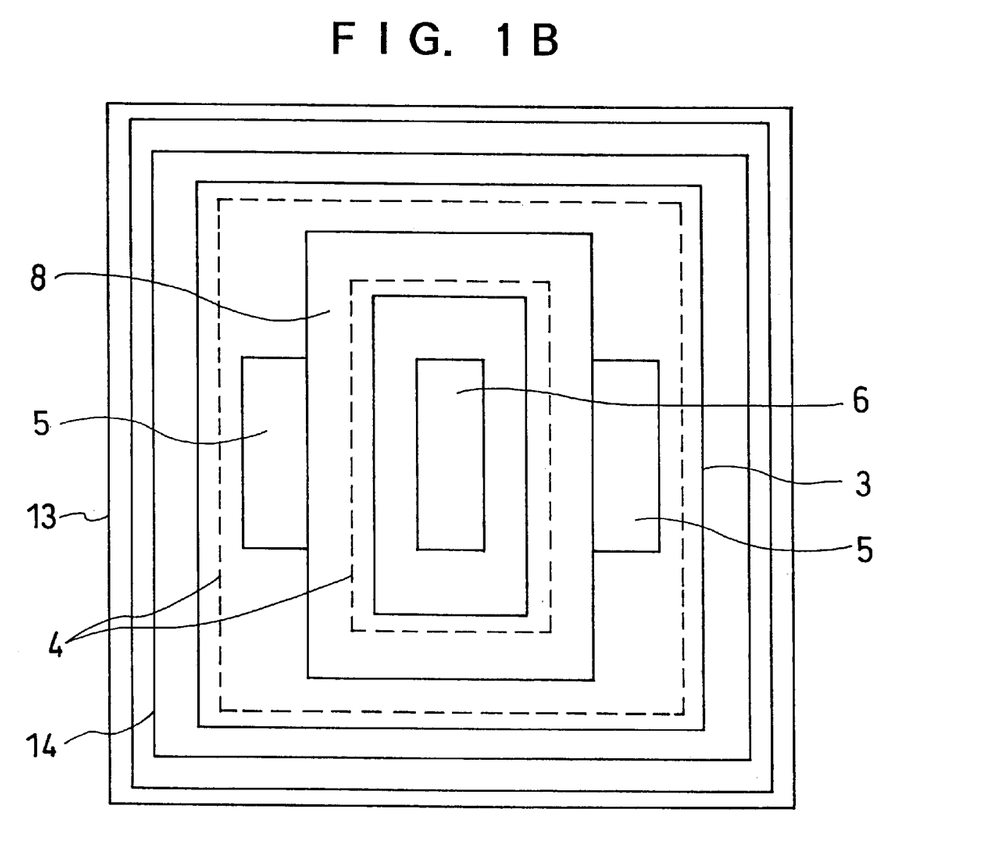
FIG. 1B is a schematic plan view of the insulated gate N-channel field effect transistor of the present invention.

FIG. 1A is a sectional view of a semiconductor element of the present invention, and FIG. 1B is a schematic plan view of the semiconductor element of the present invention. As shown in FIG. 1B, although a P-type buried layer 3 covers the whole surface of the under portion of an element region of this insulated gate field effect transistor, an N-type buried layer 13 is formed in a larger region as viewed from above in the figures, the periphery of which is surrounded by an N+ sinker 14. A P-type well layer 4 is not formed on the whole surface of the element region as in the prior art of FIG. 2, but it is formed in a region including a source region 5 and a part of an N-type low concentration region 9 other than a high concentration drain region 6. As shown in FIG. 1B, also, this P-type well layer 4 is formed inside of two dotted lines 4 of FIG. 1B so as to surround the periphery of the insulated gate field effect transistor. Thus, regions which have the same potential as the drain are three regions of a drain region 6, the N-type low concentration region 9, and an N-type epitaxial layer 2 surrounded by the P-type buried layer 3 and the P-type well layer 4. As used herein, the P-type well layer 4 and the P-type buried layer 3 that become a substrate region of this insulated gate field effect transistor are completely separated from the P-type semiconductor substrate by the N-type buried layer 13, so that the body potential of this element can be freely set without being restricted by the potential of the P-type semiconductor substrate which is the lowest potential on the semiconductor integrated circuit.

Other structures are the same as those of the conventional insulated gate field effect transistor as shown in FIG. 2. That is, since the N-type low concentration region 9 and a thick insulating film 10 are formed between the drain region 6 and the channel forming region 11, it is possible to make the withstand voltage high as compared with a general insulated gate field effect transistor.

The previously mentioned region of the N-type epitaxial layer 2 which has the same potential as the drain region 6 and is surrounded by the P-type well layer 4, is formed in such a manner that the lower portion in FIG. 1 is covered with the P-type buried layer 3, the side portion is surrounded by the P-type well layer 4, and the P-type buried layer 3 is brought into contact with the P-type well layer 4, so that a drain current does not leak from the drain to other regions is in the electric operation of the transistor. It is possible to make this region have the same function as the N-type diffusion region 12 of the prior art of FIG. 3. That is, as compared with the conventional structure of insulated gate N-channel field effect transistor as shown in FIG. 2, the ESD strength can be improved.

In other words, without adding the step of forming the N-type diffusion region 12 in the prior art of FIG. 3, the high ESD strength as well as the high withstand voltage can be realized.

The depth of this N-type epitaxial layer 2 is made 2.5 $\mu$m or more, so that an ESD strength of 2 kV can be obtained in the HBM. For example, the above condition can be satisfied by such a process that the film thickness of the epitaxial layer 2 becomes 5 $\mu$m and the upper diffusion of the P-type buried layer 3 becomes 2.5 $\mu$Vm. In the method of FIG. 1 of the present invention, for the purpose of securing the region of the N-type epitaxial layer just under the drain 6, the film thickness when the N-type epitaxial layer 2 is formed is required preferably to be at least 3.5 to 5 $\mu$m.

In addition, in FIG. 1, although such a structure is made that the high concentration drain region 6 is made the center, the gate electrode 8 is formed so as to surround it, and the source regions 5 are disposed at both sides of the drain region 6, it is not necessarily required that the source regions 5 are disposed at both sides of the drain region 6, and although not shown, there is no problem even if such a structure is adopted that the source region 5 is disposed at either one side of the high concentration drain region 6 or surrounds the entire periphery. Also in that case, the structure of a P-type well layer 4 is the same in that is includes a source region 5 and an N-type low concentration region 9 other than a high concentration drain region 6, and is formed so as to surround the high concentration drain region 6.

Figure 4A:
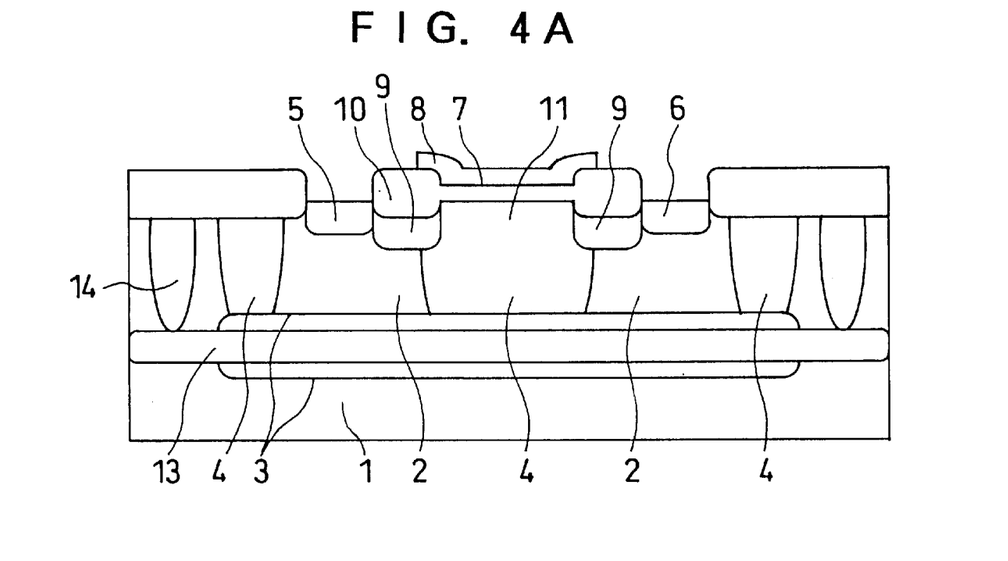
FIG. 4A is a schematic sectional view of another embodiment of the insulated gate N-channel field effect transistor according to the present invention.
Figure 4B:
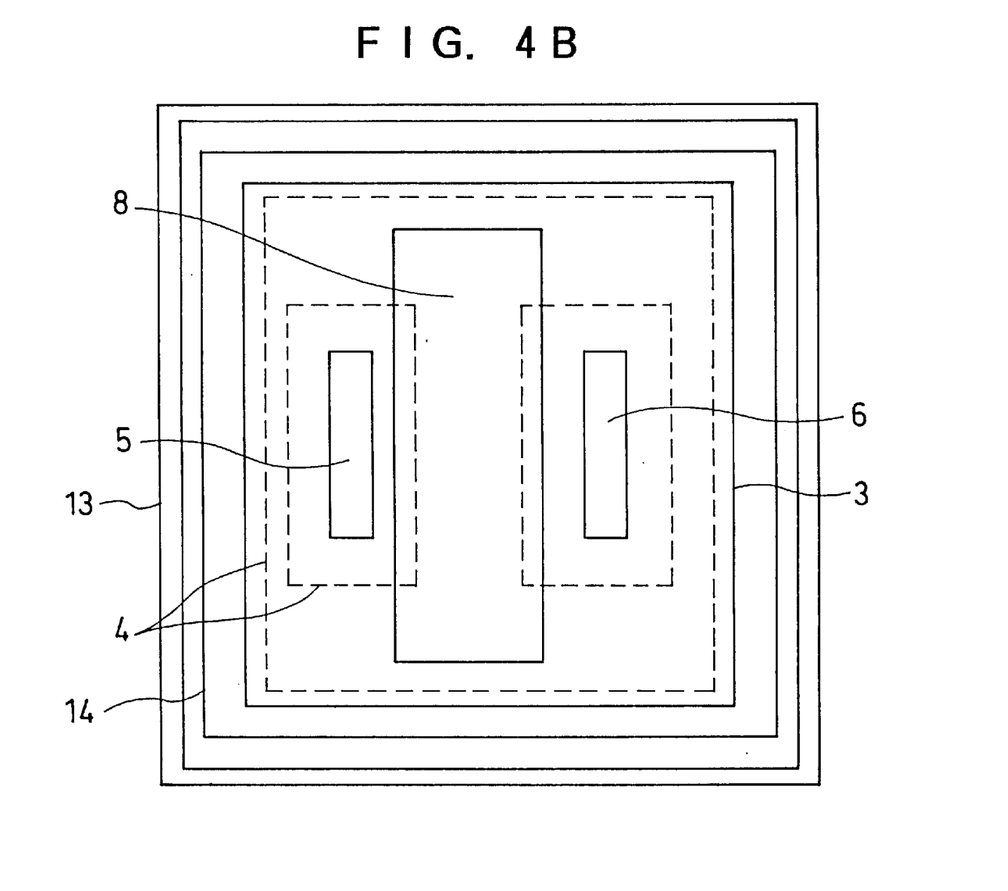
FIG. 4B is a schematic plan view of another embodiment of the insulated gate N-channel field effect transistor according to the present invention.

FIGS. 4A and 4B show another embodiment of the insulated gate N-channel field effect transistor according to the present invention. In the present invention, the N-type epitaxial region 2 surrounded by the P-type well layer 4 and the P-type buried layer 3 may be formed not only in a high concentration drain region 6 but also in a region including a high concentration source region 6. Therefore, a high ESD strength can be obtained even when either of the drain terminal or the source terminal in this transistor is connected to an external terminal.

Figure 6:
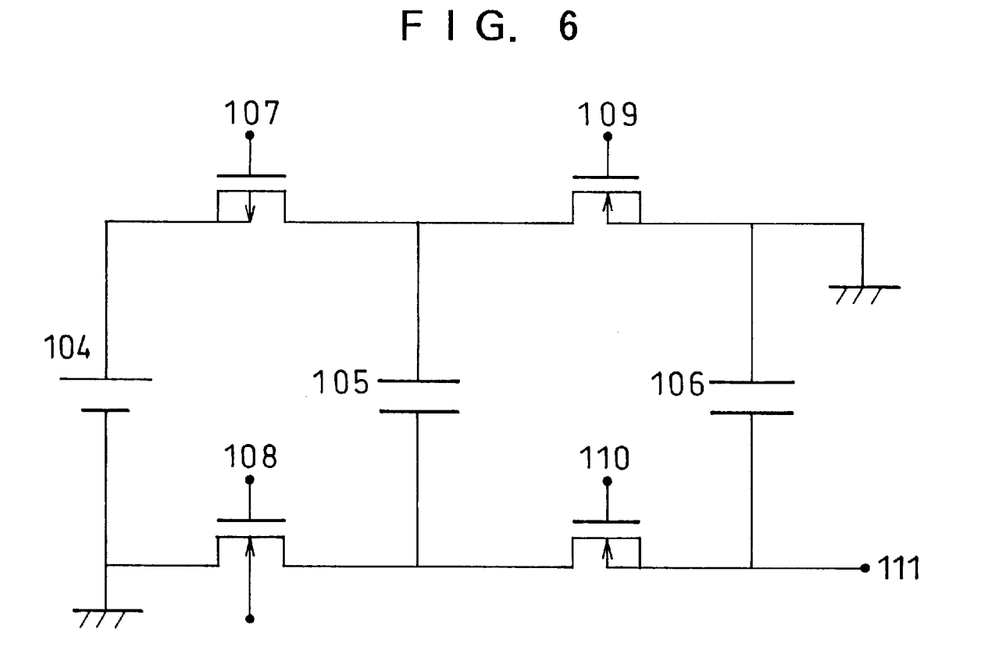
FIG. 6 is a schematic circuit diagram employing an insulated gate N-channel field effect transistor of the present invention.

Since the body potential of the insulated gate N-channel field effect transistor can be freely set for each of the elements, the present invention can be applied to a variety of types of circuits. FIG. 6 shows an inverted charge pump circuit as a circuit example employing the insulated gate N-channel field effect transistor of the present invention. In this circuit, a cycle where switches 107, 108 are conductive and switches 109, 110 are cut off and a cycle where the switches 107, 108 are cut off and the switches 109, 110 are conductive are repeated while a signal is supplied to the gate terminals of the respective switches, thus obtaining a negative power voltage value from an output terminal 111. The body potential of the switch 108 is set on the circuit so that a capacitance 105 side and a power source 104 side can be switched over depending upon either of the above cycles.

In this circuit, the body potential of the switch 110 changes into a negative potential. That is, the body potential of the switch 110 becomes lower than the potential of the P-type semiconductor substrate fixed to the ground on the circuit; however, it can be designed without taking the potential condition of the P-type semiconductor substrate into account by using the transistor shown in FIG. 1 or 4 in accordance with the present invention. In this case, it is appropriate that the potential of the N-type buried layer shown in FIG. 1 or 4 is fixed to the maximum potential in the circuit.

This embodiment refers to the case where the body potential becomes lower than the potential of the semiconductor substrate has been described. However, since the semiconductor substrate and the body region of the element are insulated and separated from each other in the present invention, the present invention can also be applied to a circuit in which the body potential becomes higher than the potential of the semiconductor substrate without taking the potential or polarity of the semiconductor substrate into account.

According to the present invention, in the insulated gate N-channel field effect transistor, it is possible to realize high withstand voltage and high ESD strength without the increase of steps and the increase of a circuit area. In addition, it is possible to freely set the body potential of a region where a channel is formed regardless of the potential of the semiconductor substrate.

What is claimed is:

1. An insulated gate N-channel field effect transistor comprising:
   a P-type semiconductor substrate;
   an N-type epitaxial layer disposed on the P-type semiconductor substrate;
   a gate insulating film disposed on the N-type epitaxial layer;
   an N-type high concentration source region formed in the N-type epitaxial layer;
   an N-type high concentration drain region formed in the N-type epitaxial layer and in spaced-apart relation to the N-type high concentration source region;
   a channel forming region disposed between the N-type high concentration source region and the N-type high concentration drain region;
   a gate electrode formed over the channel forming region;
   an N-type low concentration region disposed between the N-type high concentration drain region and the channel forming region;
   an insulating film disposed on the N-type low concentration region and having a thickness greater than that of the gate insulating film;
   a P-type well layer surrounding a region of the N-type epitaxial layer containing the N-type high concentration drain region, the P-type well layer being disposed in a region including the N-type high concentration source region, the channel forming region and only a part of a region under the insulating film so that a portion of the N-type epitaxial layer remains directly under the N-type high concentration drain region;
   an N-type buried layer disposed in a region including a boundary between the P-type semiconductor substrate and the N-type epitaxial layer, the N-type high concentration source region, the N-type high concentration drain region, the channel forming region, and the region under the insulating film; and
   a P-type buried layer disposed in a region including the N-type high concentration source region, the N-type high concentration drain region, the channel forming region, and the region under the insulating film, the P-type buried layer having a first portion extending from an upper surface of the N-type buried layer to the P-type well layer and a second portion extending from a lower surface of the N-type buried layer.

2. An insulated gate N-channel field effect transistor according to claim 1; wherein the P-type well layer is not disposed in a region under the N-type high concentration drain region.

3. An insulated gate N-channel field effect transistor comprising:
   a P-type semiconductor substrate;
   an N-type epitaxial layer disposed on the P-type semiconductor substrate;
   a gate insulating film disposed on the N-type epitaxial layer;
   an N-type high concentration source region formed in the N-type epitaxial layer;
   an N-type high concentration drain region formed in the N-type epitaxial layer and in spaced-apart relation to the N-type high concentration source region;
   a channel forming region disposed between the N-type high concentration source region and the N-type high concentration drain region;
   gate electrode formed over the channel forming region;
   an N-type low concentration region disposed between the N-type high concentration drain region and the channel forming region and between the N-type high concentration source region and the channel forming region;
   an insulating film disposed on the N-type low concentration region and having a thickness greater than that of the gate insulating film; and a P-type well layer surrounding a region of the N-type epitaxial layer containing the N-type high concentration drain and source regions, the P-type well layer being disposed in a region including the channel forming region and only a part of the region under the insulating film so that each of two portions of the N-type epitaxial layer remains directly under a respective one of the N-type high concentration drain region and the N-type high concentration source region.

4. An insulated gate N-channel field effect transistor according to claim 3; wherein the P-type well layer is not disposed in a region under the N-type high concentration drain region.

5. An insulated gate N-channel field effect transistor comprising: a P-type semiconductor substrate; an N-type epitaxial layer disposed on the P-type semiconductor substrate; a gate insulating film disposed on the N-type epitaxial layer; an N-type source region formed on the N-type epitaxial layer; an N-type drain region formed on the N-type epitaxial layer and in spaced-apart relation to the N-type source region; a channel forming region disposed between the N-type source region and the N-type drain region; a gate electrode formed over the gate insulating film between the N-type source region and the N-type drain region; a plurality of N-type low concentration regions disposed between the N-type source region and the channel forming region and between the N-type drain region and the channel forming region; a plurality of insulating films disposed on the N-type low concentration regions and having a thickness greater than that of the gate insulating film; a P-type well layer disposed in the N-type epitaxial layer under the channel forming region except in a region of the N-type epitaxial layer disposed directly under the N-type source region and the N-type drain region so as to surround the N-type source region and the N-type drain region through the epitaxial layer; an N-type buried layer disposed in a region including a boundary between the P-type semiconductor substrate and the N-type epitaxial layer; a first P-type buried layer disposed in a region including a boundary between the N-type buried layer and the P-type semiconductor substrate; and a second P-type buried layer disposed in a region including boundaries between the N-type buried layer, the N-type epitaxial layer and the P-type well layer, the second P-type buried layer being disposed in contact with the P-type well layer so as to surround the N-type source region and the N-type drain region and portions of the N-type low concentration regions through the N-type epitaxial layer.

6. An insulated gate N-channel field effect transistor according to claim 5; wherein the P-type well layer is disposed in only a part of a region under the insulating films.

7. An insulated gate N-channel field effect transistor according to claim 5; wherein a portion of the N-type epitaxial layer is disposed directly under the N-type drain region.

8. An insulated gate N-channel field effect transistor comprising: a semiconductor substrate having a first conductivity type; an epitaxial layer having a second conductivity type and being disposed on the semiconductor substrate; a gate insulating film disposed on the epitaxial layer; a source region having the second conductivity type and being formed on the epitaxial layer; a drain region having the second conductivity type and being formed on the epitaxial layer and in spaced-apart relation to the source region; a channel forming region disposed between the source region and the drain region; a gate electrode formed over the channel forming region; a low concentration region having the second conductivity type and being disposed between the drain region and the channel forming region; an insulating film disposed on the low concentration region; a well layer having the first conductivity type and surrounding a region of the epitaxial layer containing the drain region, the well layer being disposed in a region including the source region, the channel forming region and only a part of a region under the insulating film so that a portion of the epitaxial layer remains directly under the drain region; a first buried layer having the second conductivity type and being disposed in a region including a boundary between the semiconductor substrate and the epitaxial layer, the source region, the drain region, the channel forming region, and the region under the insulating film; and a second buried layer having the first conductivity type an d being disposed in a region including the source region, the drain region, the channel forming region, and the region under the insulating film, the second buried layer having a first portion extending from an upper surface of the first buried layer to the well layer and a second portion extending from a lower surface of the first buried layer.

* * * * *